(12) United States Patent
Nakajima

(10) Patent No.: US 10,095,077 B2
(45) Date of Patent: Oct. 9, 2018

(54) ELECTRO-OPTICAL DEVICE AND ELECTRONIC APPARATUS

(71) Applicant: SEIKO EPSON CORPORATION, Tokyo (JP)

(72) Inventor: Osamu Nakajima, Suwa (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/801,993

(22) Filed: Nov. 2, 2017

(65) Prior Publication Data

US 2018/0149937 A1 May 31, 2018

(30) Foreign Application Priority Data

Nov. 25, 2016 (JP) ................. 2016-228636

(51) Int. Cl.
| | |
|---|---|
| *G02F 1/1362* | (2006.01) |
| *G02F 1/1368* | (2006.01) |
| *G02F 1/1343* | (2006.01) |
| *G02F 1/1335* | (2006.01) |
| *H01L 27/12* | (2006.01) |
| *H01L 49/02* | (2006.01) |
| *H01L 29/786* | (2006.01) |

(52) U.S. Cl.
CPC ...... *G02F 1/136213* (2013.01); *G02F 1/1368* (2013.01); *G02F 1/13439* (2013.01); *G02F 1/133553* (2013.01); *G02F 1/136227* (2013.01); *G02F 1/136286* (2013.01); *H01L 27/124* (2013.01); *H01L 27/1255* (2013.01); *H01L 28/60* (2013.01); *G02F 2001/13685* (2013.01); *G02F 2001/136295* (2013.01); *G02F 2202/104* (2013.01); *H01L 27/1222* (2013.01); *H01L 29/78675* (2013.01)

(58) Field of Classification Search
CPC ......... G02F 1/136213; G02F 1/133553; G02F 1/13439; G02F 1/136227; G02F 1/136286; G02F 1/1368; G02F 2001/136295; G02F 2001/13685; H01L 27/124; H01L 27/1255; H01L 27/1222; H01L 28/60; H01L 29/78675
USPC .............................................. 257/71; 349/39
See application file for complete search history.

(56) References Cited

U.S. PATENT DOCUMENTS

| | | | |
|---|---|---|---|
| 2010/0033645 A1 | 2/2010 | Nakagawa | |
| 2017/0102596 A1* | 4/2017 | Sugimoto | ......... G02F 1/136213 |

FOREIGN PATENT DOCUMENTS

| | | |
|---|---|---|
| JP | 2010-039212 A | 2/2010 |
| JP | 2012-181308 A | 9/2012 |

(Continued)

*Primary Examiner* — Cuong Q Nguyen
*Assistant Examiner* — Tong-Ho Kim
(74) *Attorney, Agent, or Firm* — Oliff PLC

(57) ABSTRACT

In a plurality of pixels of an electro-optical device, a storage capacitor includes a first storage capacitor, and a second storage capacitor stacked on the first storage capacitor and electrically connected thereto in parallel. In the first storage capacitor and the second storage capacitor, in which the first capacitor electrode, the second capacitor electrode, the third capacitor electrode, and the fourth capacitor electrode are stacked, the second capacitor electrode and the fourth capacitor electrode are each integrally formed in a first pixel and a second pixel, out of the plurality of pixels, and electrically connected to a capacitor line at one point.

20 Claims, 12 Drawing Sheets

(56) References Cited

FOREIGN PATENT DOCUMENTS

| JP | 2014-056212 A | 3/2014 |
|---|---|---|
| JP | 2014-058212 A | 4/2014 |

* cited by examiner

ELECTRO-OPTICAL DEVICE AND ELECTRONIC APPARATUS

BACKGROUND

1. Technical Field

The present invention relates to an electro-optical device in which pixels include a storage capacitor, and an electronic apparatus including such an electro-optical device.

2. Related Art

Active-drive LCD devices, an example of electro-optical devices, are widely used as an optical modulation device (light bulb) in projection display devices such as a projector. In such electro-optical devices, a pixel electrode, a pixel switching element, a storage capacitor, and so forth are arranged in each of pixels, which are aligned in an extremely fine pitch. Therefore, a region that can be allocated to the storage capacitor is limited, and hence the electrostatic capacitance of the storage capacitor is also limited.

Accordingly, a structure has been proposed in which each of a plurality of pixels includes a first capacitor electrode electrically connected to a pixel electrode, a second capacitor electrode electrically connected to a capacitor line to constitute a first storage capacitor in collaboration with the first capacitor electrode, a third capacitor electrode electrically connected to the pixel electrode, and a fourth capacitor electrode electrically connected to the capacitor line to constitute a second storage capacitor in collaboration with the third capacitor electrode, the first to the fourth capacitor electrode being sequentially stacked on each other, for example as disclosed in JP-A-2014-56212.

In such a configuration including the plurality of capacitor electrodes stacked on each other, as disclosed in JP-A-2014-56212, the capacitor electrodes and wirings have to be electrically connected via a large number of contact holes. With the configuration according to JP-A-2014-56212, therefore, it is difficult to align the pixels in a finer pitch, because of restrictions on the availability of the area for the contact holes, and on the layout design thereof.

SUMMARY

An advantage of some aspects of the invention is to provide an electro-optical device and an electronic apparatus that enable the pixels, each including a plurality of capacitor electrodes stacked therein, to be aligned in a finer pitch.

In an aspect, the invention provides an electro-optical device including a plurality of pixels aligned in a first direction, and a second direction intersecting the first direction, and a capacitor line extending in at least one of the first direction and the second direction. The plurality of pixels each include a pixel electrode, a pixel switching element, and a storage capacitor which are located on a side of a first surface of an element substrate, the pixel switching element and the storage capacitor being electrically connected to the pixel electrode. The storage capacitor includes, between the element substrate and the capacitor line, a first storage capacitor, and a second storage capacitor stacked on the first storage capacitor and electrically connected thereto in parallel. The first storage capacitor includes a first capacitor electrode electrically connected to the pixel electrode, and a second capacitor electrode electrically connected to the capacitor line and stacked on the first capacitor electrode via a first dielectric layer. The second storage capacitor includes a third capacitor electrode electrically connected to the pixel electrode, and a fourth capacitor electrode electrically connected to the capacitor line and stacked on the third capacitor electrode via a second dielectric layer. The second capacitor electrode is integrally formed in a first pixel and a second pixel out of the plurality of pixels, the second pixel being located adjacent the first pixel in the first direction, and is electrically connected to the capacitor line at least at one point.

In the electro-optical device thus configured, the second storage capacitor is stacked on the first storage capacitor between the element substrate and the pixel electrode, in the storage capacitor provided in each of the plurality of pixels. Therefore, the plan-view area occupied by the storage capacitor is not increased, despite increasing the electrostatic capacitance of the storage capacitor. In addition, in the first storage capacitor and the second storage capacitor, in which the first capacitor electrode, the second capacitor electrode, the third capacitor electrode, and the fourth capacitor electrode are stacked, the second capacitor electrode is integrally formed in the first pixel and the second pixel out of the plurality of pixels, and electrically connected to the capacitor line at least at one point. The mentioned configuration allows reduction in number of the contact holes between the second capacitor electrode and the capacitor line, to thereby alleviate the difficulty in aligning the pixels in a finer pitch, originating from restrictions on the availability of the area for the contact holes, and on the layout design thereof. Consequently, the above configuration facilitates the pixels, each including the plurality of capacitor electrodes stacked therein, to be aligned in a finer pitch.

In the foregoing electro-optical device, the fourth capacitor electrode may be integrally formed in the first pixel and the second pixel, and electrically connected to the capacitor line at one point. The mentioned configuration allows reduction in number of the contact holes between the fourth capacitor electrode and the capacitor line, to thereby alleviate the difficulty in aligning the pixels in a finer pitch, originating from restrictions on the availability of the area for the contact holes, and on the layout design thereof. Consequently, the above configuration facilitates the pixels, each including the plurality of capacitor electrodes stacked therein, to be aligned in a finer pitch.

In the foregoing electro-optical device, the capacitor line may be electrically connected to the second capacitor electrode and the fourth capacitor electrode, at the same point. The mentioned configuration allows reduction in number of the contact holes, to thereby alleviate the difficulty in aligning the pixels in a finer pitch, originating from restrictions on the availability of the area for the contact holes, and on the layout design thereof. Consequently, the above configuration facilitates the pixels, each including the plurality of capacitor electrodes stacked therein, to be aligned in a finer pitch.

In the foregoing electro-optical device, the capacitor line may be electrically connected to a central portion of the second capacitor electrode in the first direction, and to a central portion of the fourth capacitor electrode in the first direction. The mentioned configuration suppresses fluctuation in electric resistance in each of the pixels including the second capacitor electrode and the fourth capacitor electrode, despite the second capacitor electrode and the fourth capacitor electrode being integrally formed in a plurality of pixels.

In the foregoing electro-optical device, the fourth capacitor electrode, the second dielectric layer, the third capacitor electrode, the first capacitor electrode, the first dielectric layer, and the second capacitor electrode may be sequentially stacked between the element substrate and the capacitor line, and the capacitor line may be electrically connected to the second capacitor electrode and the fourth capacitor electrode, via a conductive layer formed in a first contact hole, penetrating through a first interlayer insulating film formed between the second capacitor electrode and the capacitor line, and exposing a part of a surface of the second capacitor electrode opposite to the element substrate, and a part of a surface of the fourth capacitor electrode opposite to the element substrate. The mentioned configuration allows the capacitor line to be electrically connected to the second capacitor electrode and the fourth capacitor electrode at the same point, utilizing the single contact hole and the commonly shared conductive layer.

In the foregoing electro-optical device, the fourth capacitor electrode, the second dielectric layer, the third capacitor electrode, the first capacitor electrode, the first dielectric layer, and the second capacitor electrode may be sequentially stacked between the element substrate and the capacitor line, and the first capacitor electrode may be stacked together with the first dielectric layer and the second capacitor electrode, inside a second contact hole, formed so as to penetrate through a second interlayer insulating film formed between the pixel switching element and the first capacitor electrode, and to reach the pixel switching element, and electrically connected to the pixel switching element. The mentioned configuration allows a portion of the contact hole along the inner wall thereof to be utilized as a region where the first storage capacitor is to be formed, thereby facilitating an increase in electrostatic capacitance of the first storage capacitor.

In the foregoing electro-optical device, the capacitor line may include an aluminum wiring layer, and the second capacitor electrode and the fourth capacitor electrode may each include a conductive polysilicon layer or a metal silicide layer.

The foregoing electro-optical device may further include a data line extending in the first direction, and the plurality of pixels may each include a semiconductor layer constituting a part of the pixel switching element, and the semiconductor layer may be integrally formed in two pixels out of the plurality of pixels, the two pixels being located adjacent to each other in the first direction. The mentioned configuration allows reduction in number of the contact holes connecting between the semiconductor layer and the data line, to thereby alleviate the difficulty in aligning the pixels in a finer pitch, originating from restrictions on the availability of the area for the contact holes, and on the layout design thereof.

In the foregoing electro-optical device, the semiconductor layer may be integrally formed in the first pixel, and a third pixel adjacent thereto on an opposite side of the second pixel.

The foregoing electro-optical device may further include a translucent counter substrate opposing the first surface of the element substrate, and the pixel electrode may include a reflective conductive layer. The mentioned configuration allows the electro-optical device to be set up as a reflection-type device.

The electro-optical device configured as above may be incorporated in various types of electronic apparatuses, such as a direct-view display apparatus and a projection display apparatus. In the case where the electro-optical device is incorporated in the projection display apparatus, the projection display apparatus may include a light source unit that outputs light to be supplied to the electro-optical device, and a projection optical system that projects the light modulated by the electro-optical device.

BRIEF DESCRIPTION OF THE DRAWINGS

The invention will be described with reference to the accompanying drawings, wherein like numbers reference like elements.

DESCRIPTION OF EXEMPLARY EMBODIMENT

Figure 1:
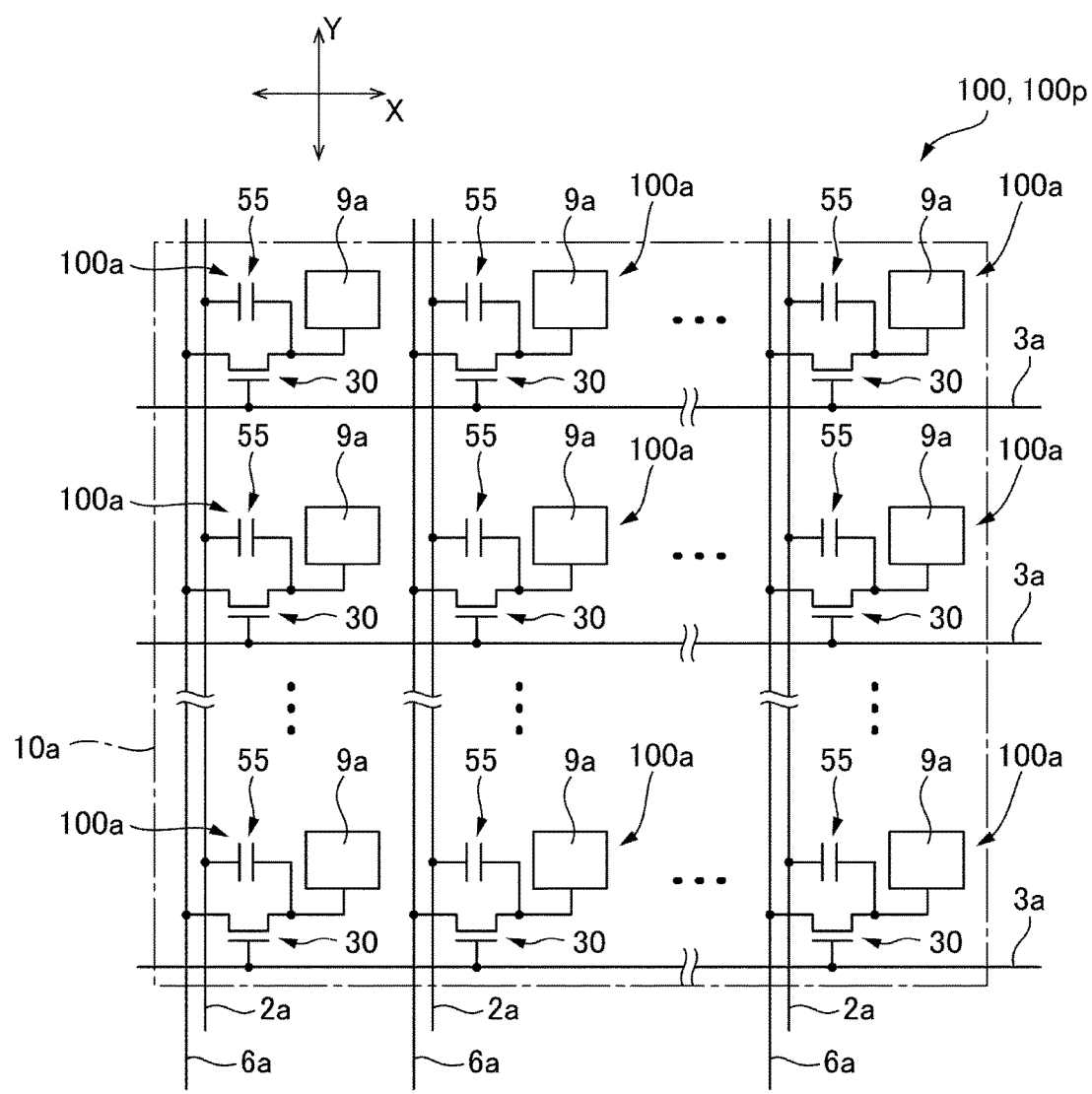
FIG. 1 is a block diagram showing an electrical configuration of an electro-optical device according to an embodiment of the invention.

Hereafter, an embodiment of the invention will be described with reference to the drawings. In the drawings referred to hereunder, each of the layers and elements may be illustrated in different scale ratio, for better visual understanding. In the description given hereunder, a first direction is denoted by Y, and a second direction intersecting the first direction Y is denoted by X. Although when the direction of the current flowing through a field effect transistor serving as a pixel switching element is inverted, the source and the drain are replaced with each other, the side to which the pixel electrode is connected will be referred to as drain, and the side to which the data line is connected will be referred to as source in the description given below, for the sake of convenience. Regarding layers formed on an element substrate, an upper layer or a layer on the surface side refers to the layer more distant from the main body of the element substrate, in other words the layer closer to a counter substrate, and a lower layer refers to the layer closer to the main body of the element substrate. Regarding layers formed on the counter substrate, an upper layer or a layer on the surface side refers to the layer more distant from the main body of the counter substrate, in other words the layer closer to the element substrate, and a lower layer refers to the layer closer to the main body of the counter substrate.

FIG. 1 is a block diagram showing an electrical configuration of an essential part of an electro-optical device according to the embodiment of the invention. In FIG. 1, an electro-optical device 100 is an LCD device including an LCD panel 100p of a twisted nematic (TN) mode or a vertical alignment (VA) mode, and the LCD panel 100p includes, in a central region thereof, a display region 10a where a plurality of pixels 100a are aligned in a matrix pattern. The LCD panel 100p includes a plurality of data lines 6a and a plurality of scanning lines 3a, extending in the first direction Y and the second direction X respectively inside the display region 10a, on an element substrate 10 to be subsequently described with reference to FIG. 2 and FIG. 3, and the pixels 100a are each located at a position corresponding to the intersection of the data line 6a and the scanning line 3a. The pixels 100a each include a pixel switching element 30 constituted of a field effect transistor, and a pixel electrode 9a electrically connected to the pixel switching element 30. The data line 6a is electrically connected to the source of the pixel switching element 30, the scanning line 3a is electrically connected to the gate of the pixel switching element 30, and the pixel electrode 9a is electrically connected to the drain of the pixel switching element 30. Image signals are provided to the data line 6a, and scanning signals are provided to the scanning line 3a.

In each of the pixels 100a, the pixel electrode 9a is opposed to a common electrode 21 formed on a counter substrate 20 (see FIG. 2 and FIG. 3) to be subsequently described, via an electro-optical layer 50, so as to form a liquid crystal capacitance. The pixels 100a each include a storage capacitor 55 added parallel to the liquid crystal capacitance, to prevent fluctuation of the image signal retained by the liquid crystal capacitance. In this embodiment, a capacitor line 2a is formed on the element substrate 10 so as to span over a plurality of pixels 100a, to provide the storage capacitor 55, and a common potential Vcom is supplied to the capacitor line 2a. In this embodiment, the capacitor line 2a extends along the data line 6a, in the first direction Y.

Specific Configuration of LCD Panel 100p and Element Substrate 10

Figure 2:
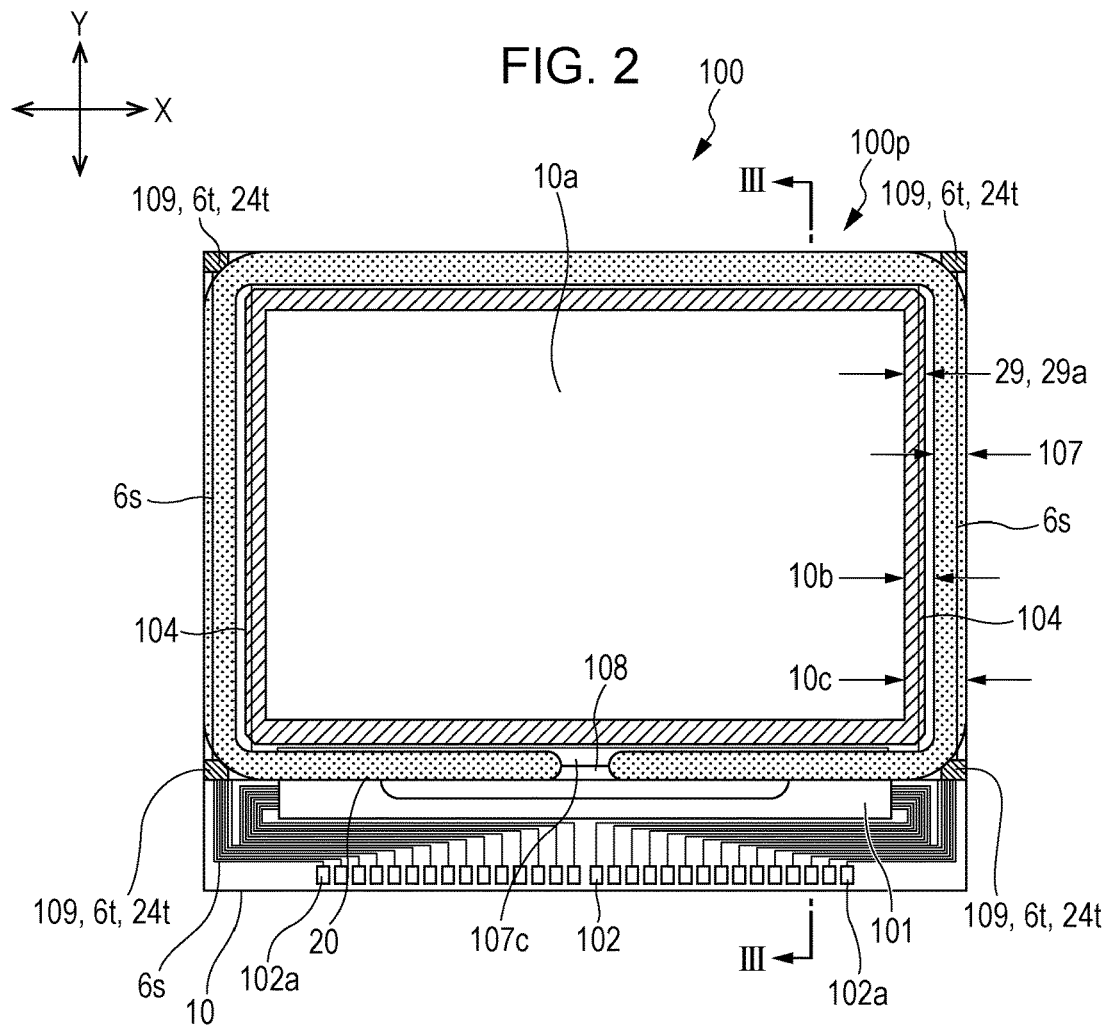
FIG. 2 is a schematic plan view showing an actual structure of the electro-optical device of FIG. 1.
Figure 3:
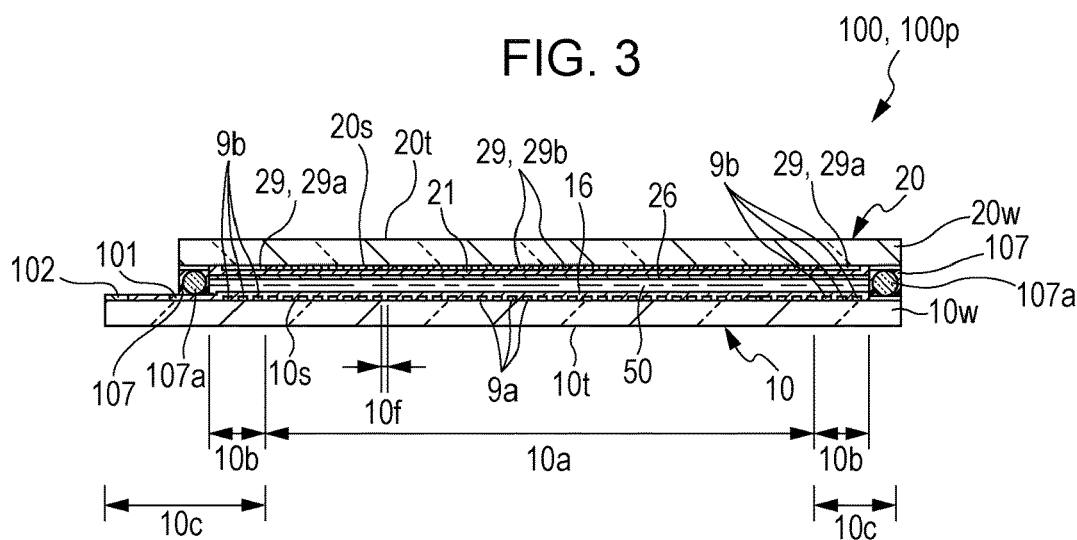
FIG. 3 is a cross-sectional view of the electro-optical device, taken along a line III-III in FIG. 2.

FIG. 2 is a schematic plan view showing an actual structure of the electro-optical device 100 of FIG. 1. FIG. 3 is a cross-sectional view of the electro-optical device 100, taken along a line III-III in FIG. 2.

As shown in FIG. 2 and FIG. 3, the element substrate 10 and the counter substrate 20 are bonded together with a predetermined gap therebetween via a seal material 107, in the LCD panel 100p of the electro-optical device 100, and the seal material 107 is provided in a frame shape along the outer periphery of the counter substrate 20. The seal material 107 is an adhesive made of a photo-curing resin or a thermosetting resin, and contains a gap material 107a formed of a glass fiber or glass beads, to set the gap between the substrates to the predetermined distance. The LCD panel 100p includes the electro-optical layer 50 formed of a liquid crystal layer, located in the region surrounded by the seal material 107, between the element substrate 10 and the counter substrate 20. In this embodiment, the seal material 107 includes an opening 107c for loading the liquid crystal therethrough. The opening 107c is closed by a seal material 108, after the liquid crystal material is loaded. In the case where the liquid crystal material is loaded by a dropping method, it is not necessary to form the opening 107c.

In the LCD panel 100p configured as above, the element substrate 10 and the counter substrate 20 are both rectangular, and the display region 10a described with reference to FIG. 1 is formed in a rectangular shape in the generally central region of the LCD panel 100p. Accordingly, the seal material 107 is also formed in a generally rectangular shape, and an outer peripheral region 10c of a rectangular frame shape is provided on the outer side of the display region 10a.

In the element substrate 10, a data line drive circuit 101 and a plurality of terminals 102 are formed along a side of the element substrate 10, in a portion of the outer peripheral region 10c where the element substrate 10 protrudes from the counter substrate 20, and a scanning line drive circuit 104 is formed along another side of the element substrate 10 adjacent to the side along which the data line drive circuit 101 is formed. The terminal 102 is located on the outer side of the seal material 107. A non-illustrated flexible circuit board is connected to the terminal 102, so that potentials and signals are inputted to the element substrate 10 through the flexible circuit board. In this embodiment, the data line drive circuit 101 and the scanning line drive circuit 104 partially overlap the seal material 107, in a plan view.

As will be subsequently described in further detail, the element substrate 10 includes a translucent main body 10w, formed of quartz or glass, and the pixel switching element 30 and the pixel electrode 9a electrically connected to the pixel switching element 30, described with reference to FIG. 1, are formed in a matrix pattern in the display region 10a, on the side of a first surface 10s opposing the counter substrate 20, out of the first surface 10s and a second surface 10t of the element substrate 10 (main body 10w). A first alignment layer 16 is formed on the upper side of the pixel electrode 9a.

In addition, on the side of the first surface 10s of the element substrate 10, a dummy pixel electrode 9b, simultaneously formed with the pixel electrode 9a, is provided in a peripheral region 10b of a rectangular frame shape, located between the display region 10a and the seal material 107, in the outer peripheral region 10c on the outer side of the display region 10a.

The counter substrate 20 includes a translucent main body 20w, formed of quartz or glass, and a common electrode 21 is formed on the side of a first surface 20s opposing the element substrate 10, out of the first surface 20s and a second surface 20t of the counter substrate 20 (main body 20w). The common electrode 21 may be formed generally over the entirety of the counter substrate 20, or constituted of a plurality of strip electrodes provided over a region covering a plurality of pixels 100a. In this embodiment, the common electrode 21 is formed generally over the entirety of the counter substrate 20.

On the side of the first surface 20s of the counter substrate 20, a light shielding layer 29 is formed on the lower side of the common electrode 21, and a second alignment layer 26 is stacked on the surface of the common electrode 21 on the side of the electro-optical layer 50. The light shielding layer 29 is formed as a frame-shaped region 29a extending along the outer periphery of the display region 10a. The light shielding layer 29 may include a black matrix region 29b superposed on a region between pixels 10f, defined between the pixel electrodes 9a adjacent to each other. The frame-shaped region 29a is located on the position overlapping the dummy pixel electrode 9b in a plan view, such that the outer peripheral edge of the frame-shaped region 29a is spaced from the inner peripheral edge of the seal material 107. Therefore, the frame-shaped region 29a and the seal material 107 are deviated from each other.

In this embodiment, the first alignment layer 16 and the second alignment layer 26 are inorganic alignment layers formed of an obliquely deposited film of $SiO_x$ (x≤2), $TiO_2$, MgO, or $Al_2O_3$, and include a column-shaped structure in which a column is obliquely formed with respect to the element substrate 10 and the counter substrate 20. Accordingly, the nematic liquid crystal molecules having negative dielectric anisotropy, employed in the first alignment layer 16, the second alignment layer 26, and the electro-optical layer 50, are pretilted such that the liquid crystal molecules are aligned with an oblique inclination with respect to the element substrate 10 and the counter substrate 20. Thus, the electro-optical device 100 is configured as an LCD device of a normally black VA mode.

In the outer region of the seal material 107 in the LCD panel 100p, an inter-substrate connection electrode 24t is formed on each of the four corners of the first surface 20s of the counter substrate 20, and an inter-substrate connection electrode 6t is formed on each of the four corners of the first surface 10s of the element substrate 10, at the position corresponding to the four corners of the counter substrate 20 (i.e., inter-substrate connection electrode 24t). The inter-substrate connection electrode 6t is electrically connected to a constant potential wiring 6s to which the common potential Vcom is applied, and the constant potential wiring 6s is electrically connected to a terminal 102a used for applying the common potential, out of the terminals 102. An inter-substrate conductor 109 containing conductive particles is provided between the inter-substrate connection electrode 6t and the inter-substrate connection electrode 24t, and the common electrode 21 of the counter substrate 20 is electrically connected to the element substrate 10, via the inter-substrate connection electrode 6t, the inter-substrate conductor 109, and the inter-substrate connection electrode 24t. Therefore, the common electrode 21 receives the common potential Vcom from the side of the element substrate 10.

The seal material 107 is provided along the outer periphery of the counter substrate 20, in a generally constant width. Accordingly, the seal material 107 is generally rectangular. Here, the seal material 107 is formed so as to circumvent the inter-substrate connection electrodes 6t and 24t and pass an inner region, at the region corresponding to each of the corners of the counter substrate 20, and hence the corners of the seal material 107 are generally arcuate.

The electro-optical device 100 according to this embodiment is a reflection-type LCD device. Accordingly, the pixel electrode 9a includes a reflective conductive layer, for example including an aluminum film or an aluminum alloy film, and the common electrode 21 includes a translucent conductive layer, for example including an indium tin oxide (ITO) film or an indium zinc oxide (IZO) film. Therefore, light that has entered from the side of the counter substrate 20 is reflected by the element substrate 10, and modulated while being outputted through the counter substrate 20, to thereby display an image.

The electro-optical device 100 can be incorporated in an electronic apparatus such as a mobile computer or a mobile phone, to serve as a color display device, in which case a non-illustrated color filter is provided in the counter substrate 20 or the element substrate 10. The electro-optical device 100 can also be incorporated in a projection display device (liquid crystal projector) to be subsequently described, to serve as a light bulb for RGB colors. In this case, the electro-optical device 100 for each of the RGB colors receives, as incident light, the light of the corresponding RGB color, for example separated by a dichroic mirror for RGB separation, and hence the color filter is not provided.

Electric Configuration of Pixel 100a

Figure 4:
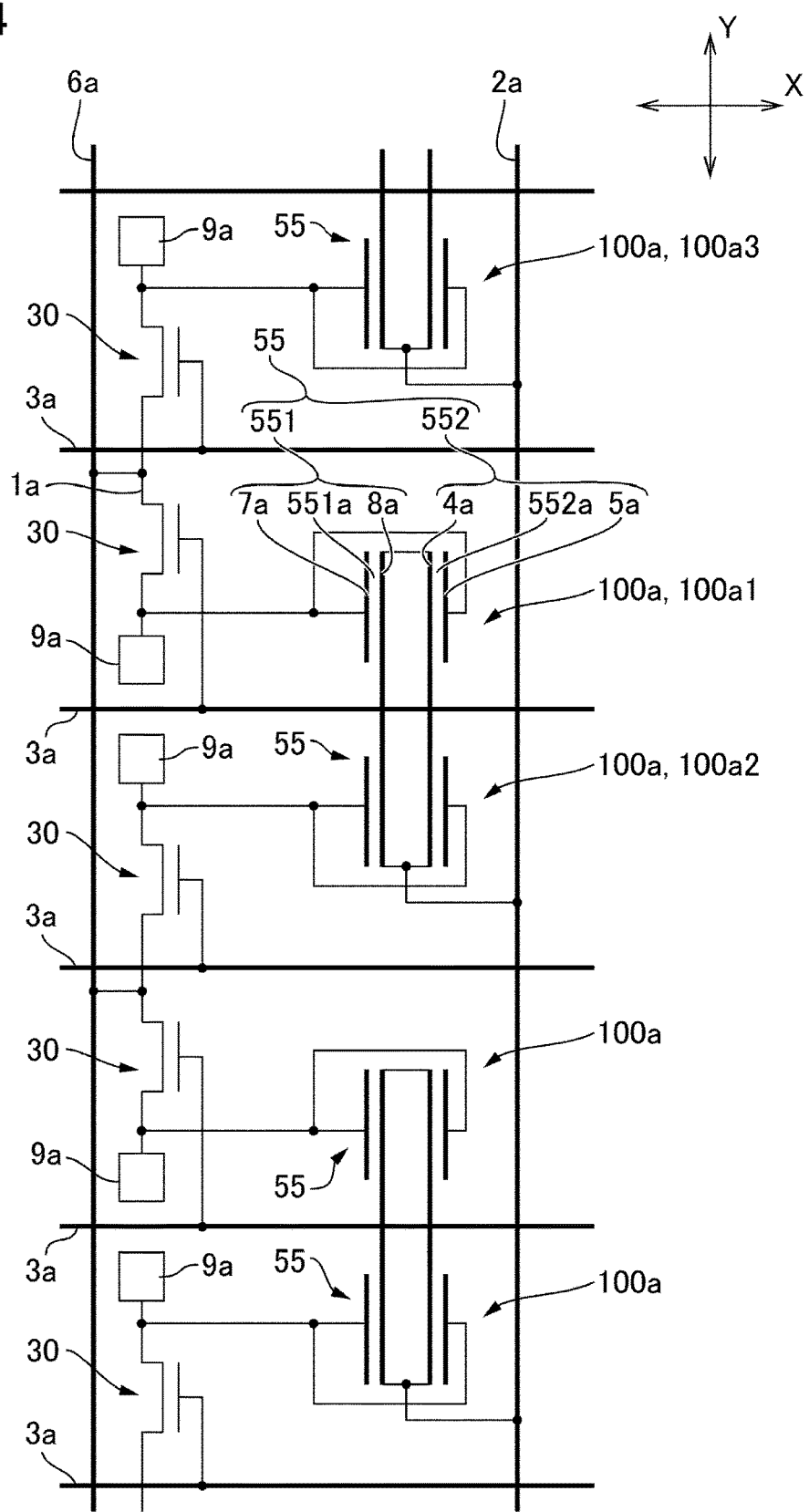
FIG. 4 is a block diagram showing an electrical configuration of pixels in the electro-optical device of FIG. 1.

FIG. 4 is a block diagram showing an electrical configuration of the pixels 100a in the electro-optical device 100 of FIG. 1. As shown in FIG. 4, in each of the plurality of pixels 100a of the electro-optical device 100 according to this embodiment, the storage capacitor 55 includes a first storage capacitor 551 and a second storage capacitor 552 electrically connected in parallel to the first storage capacitor 551. The first storage capacitor 551 includes a first capacitor electrode 7a electrically connected to the pixel electrode 9a, a second capacitor electrode 8a electrically connected to the capacitor line 2a, and a first dielectric layer 551a formed between the first capacitor electrode 7a and the second capacitor electrode 8a. The second storage capacitor 552 includes a third capacitor electrode 5a electrically connected to the pixel electrode 9a, a fourth capacitor electrode 4a electrically connected to the capacitor line 2a, and a second dielectric layer 552a formed between the third capacitor electrode 5a and the fourth capacitor electrode 4a.

The second capacitor electrode 8a is integrally formed in, out of the plurality of pixels 100a, a first pixel 100a1 and a second pixel 100a2 adjacent to the first pixel 100a1 in the first direction Y, and is electrically connected to the capacitor line 2a at one point. The fourth capacitor electrode 4a is integrally formed in the first pixel 100a1 and the second pixel 100a2, and electrically connected to the capacitor line 2a at one point. Thus, the second capacitor electrode 8a and the fourth capacitor electrode 4a are shared by the first pixel 100a1 and the second pixel 100a2, and therefore the common potential Vcom can be supplied to the second capacitor electrode 8a and the fourth capacitor electrode 4a through only one connection point.

The pixels 100a each include a semiconductor layer 1a constituting a part of the pixel switching element 30, which is integrally formed in two pixels 100a adjacent to each other in the first direction Y, out of the plurality of pixels 100a, and is electrically connected to the data line 6a at one point. In this embodiment, the two pixels 100a that share the semiconductor layer 1a are the first pixel 100a1 and a third pixel 100a3 adjacent to the first pixel 100a1 on the opposite side of the second pixel 100a2, in other words the semiconductor layer 1a is integrally formed in the first pixel 100a1 and the third pixel 100a3, and electrically connected to the data line 6a at one point. Since the semiconductor layer 1a is thus integrally formed in the first pixel 100a1 and the third pixel 100a3, the image signal can be provided to the first pixel 100a1 and the third pixel 100a3, through only one connection point between the semiconductor layer 1a and the data line 6a.

Specific Configuration of Pixel 100a

Figure 5:
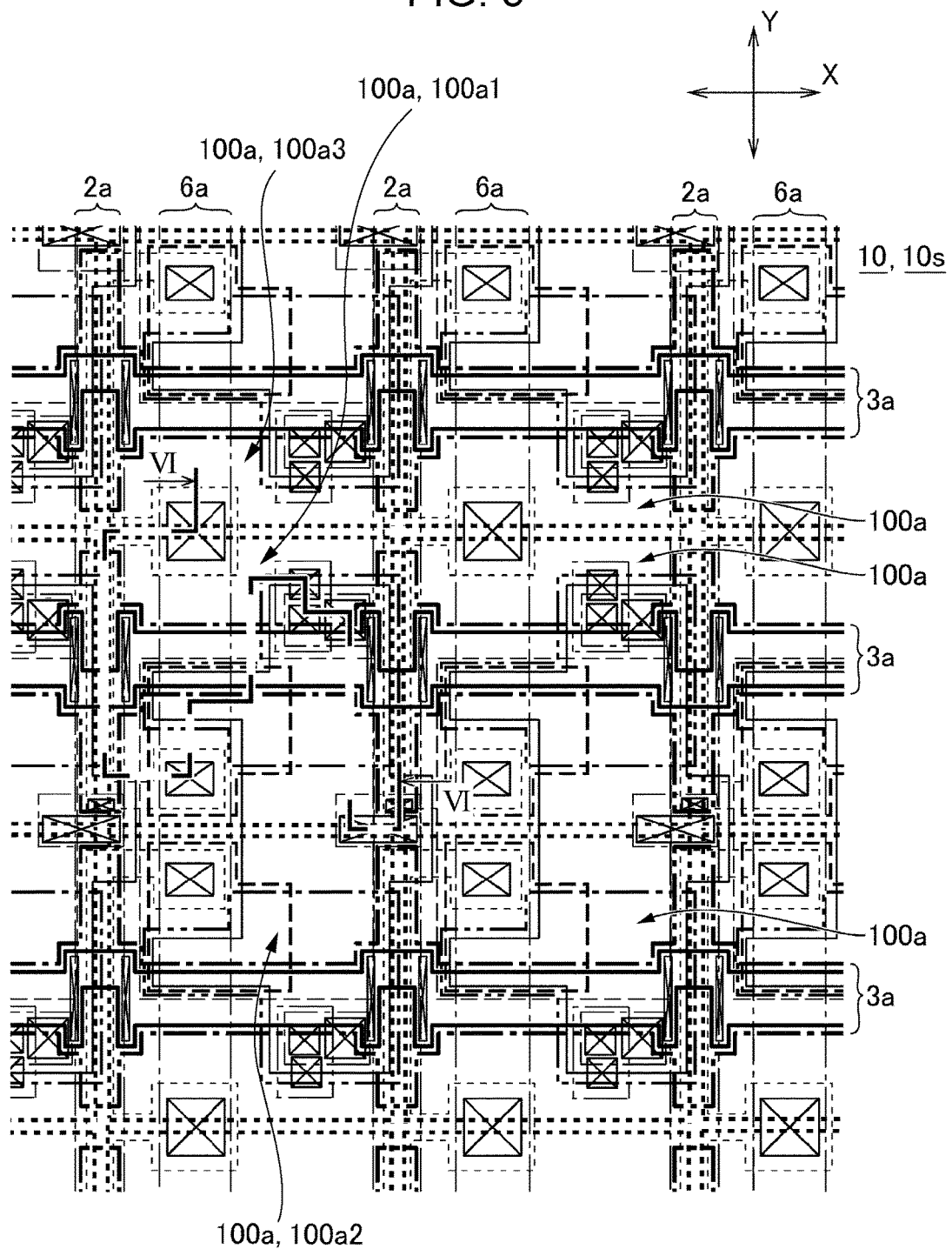
FIG. 5 is a schematic plan view showing an actual structure of the pixels in the electro-optical device of FIG. 1.
Figure 6:
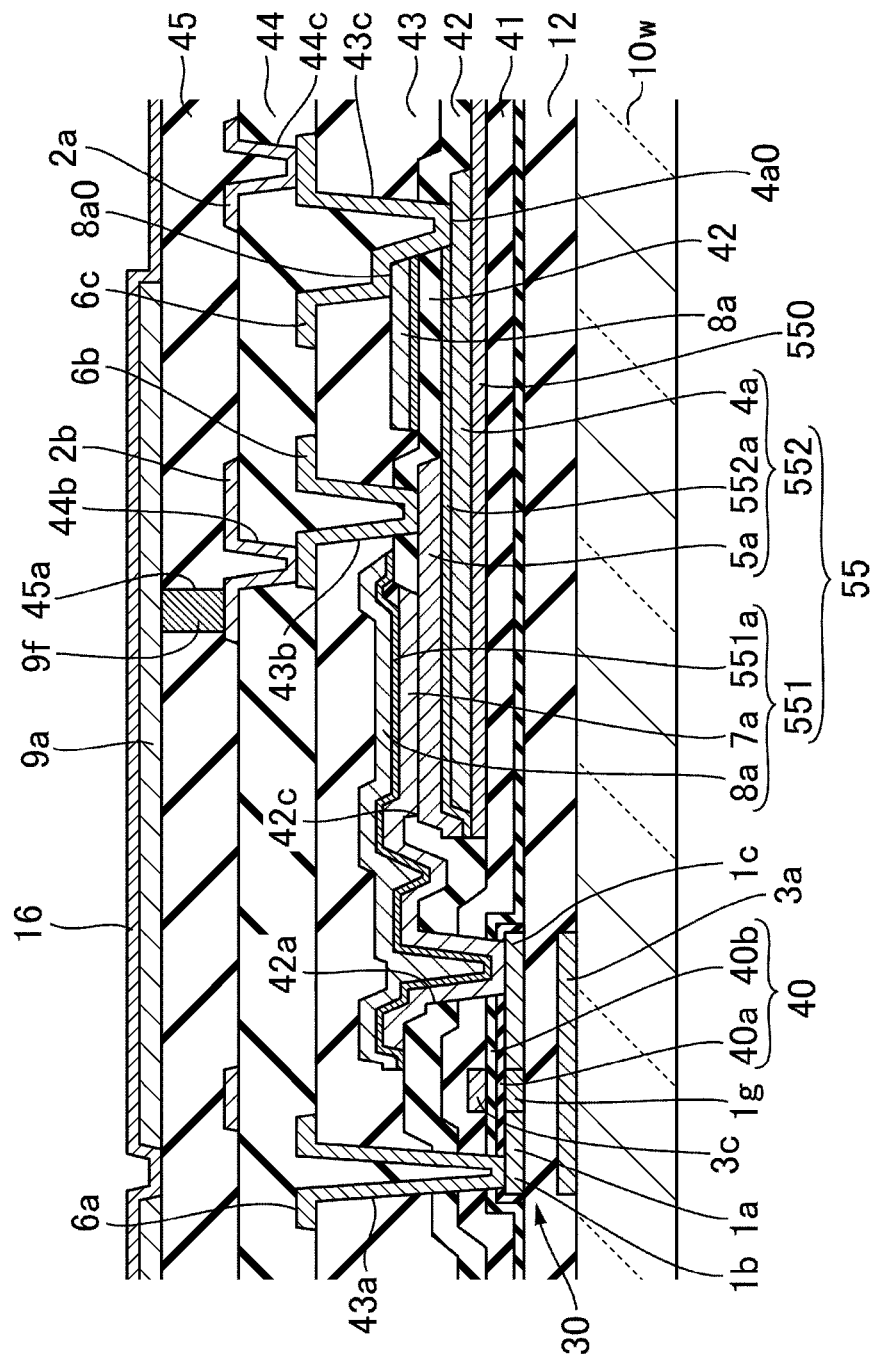
FIG. 6 is a cross-sectional view of the pixel shown in FIG. 5.
Figure 7:
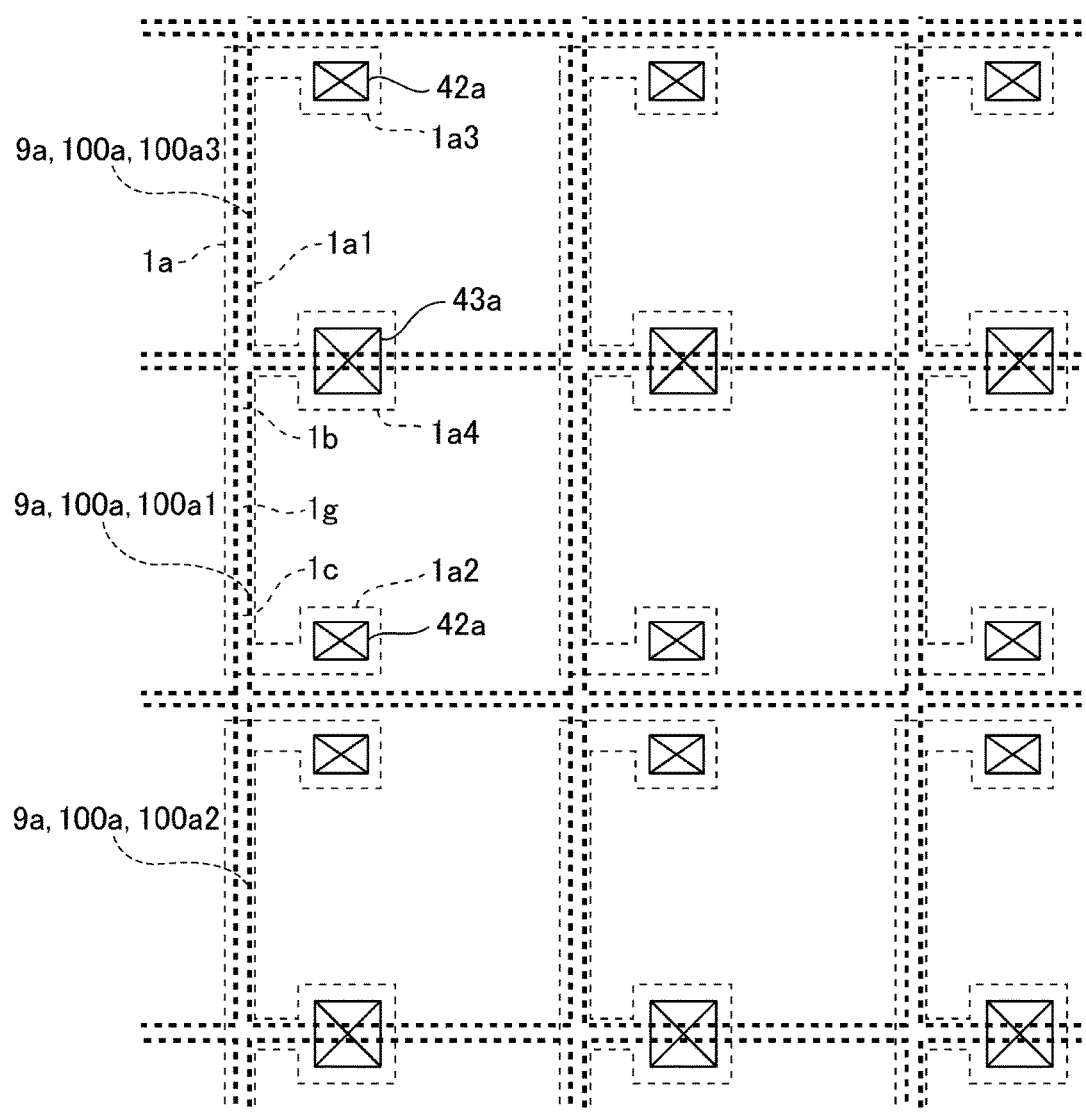
FIG. 7 is a schematic plan view of semiconductor layers and related elements shown in FIG. 5.
Figure 8:
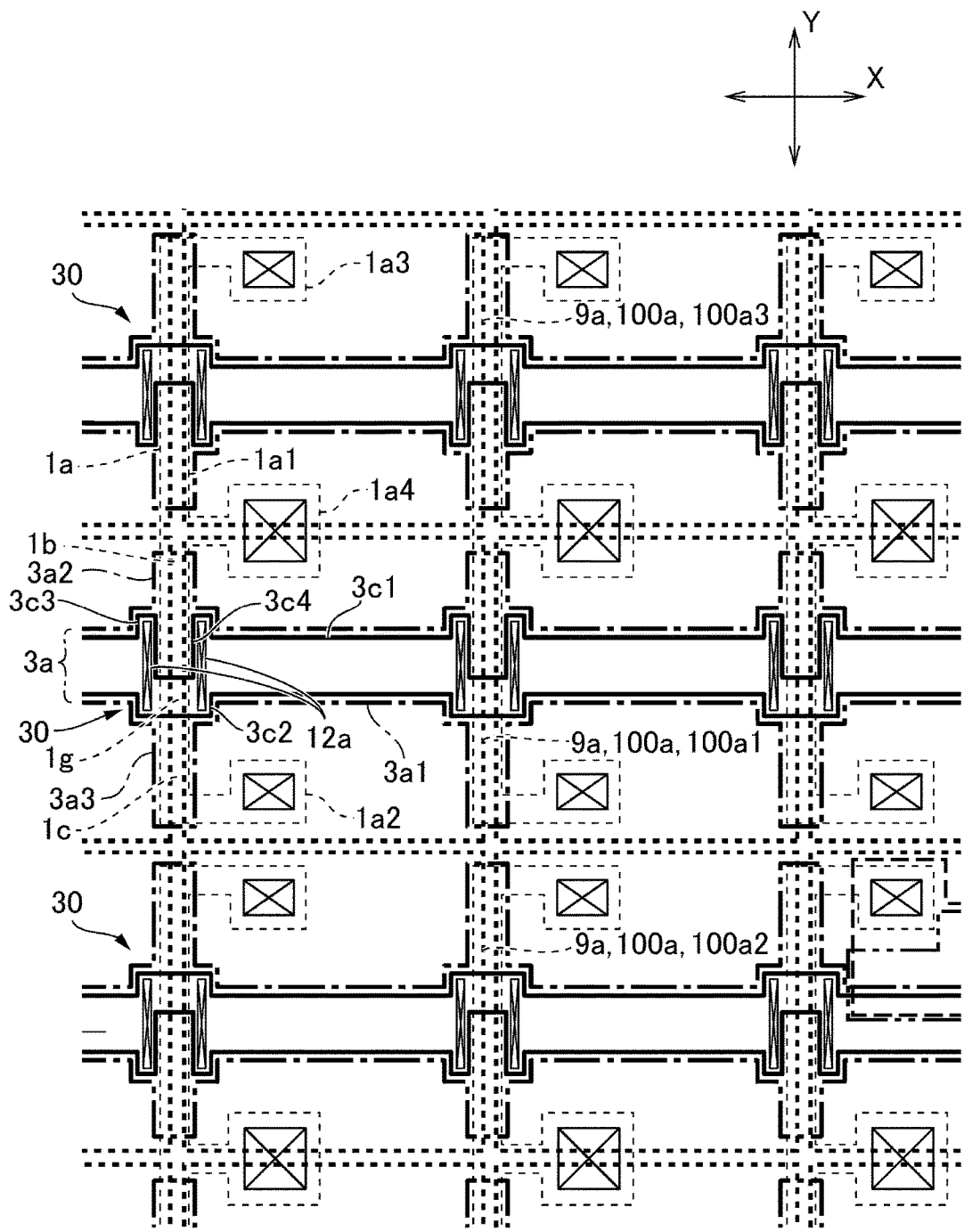
FIG. 8 is a schematic plan view of scanning lines and related elements shown in FIG. 5.
Figure 9:
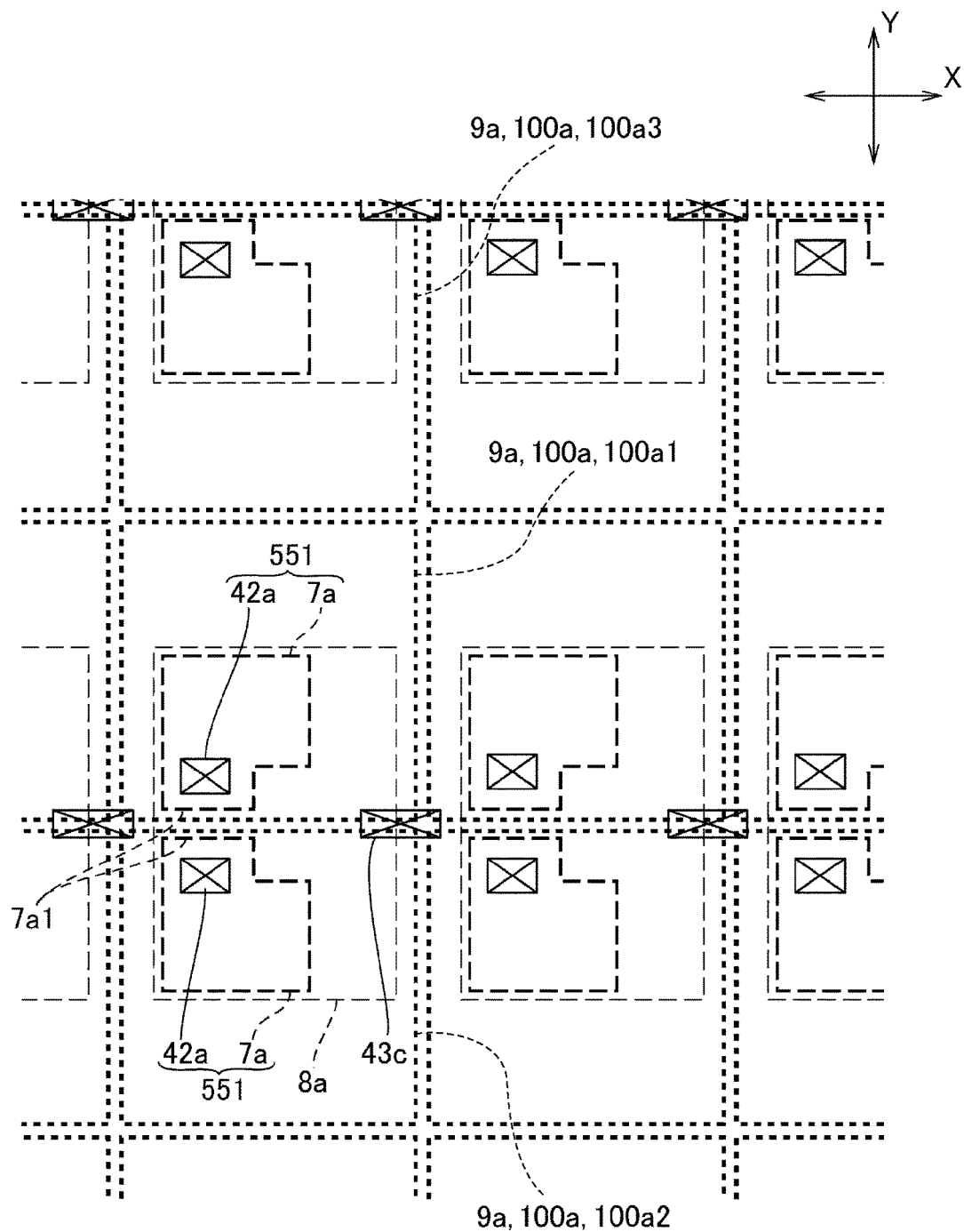
FIG. 9 is a schematic plan view of a first capacitor electrode, a second capacitor electrode, and related elements shown in FIG. 5.
Figure 10:
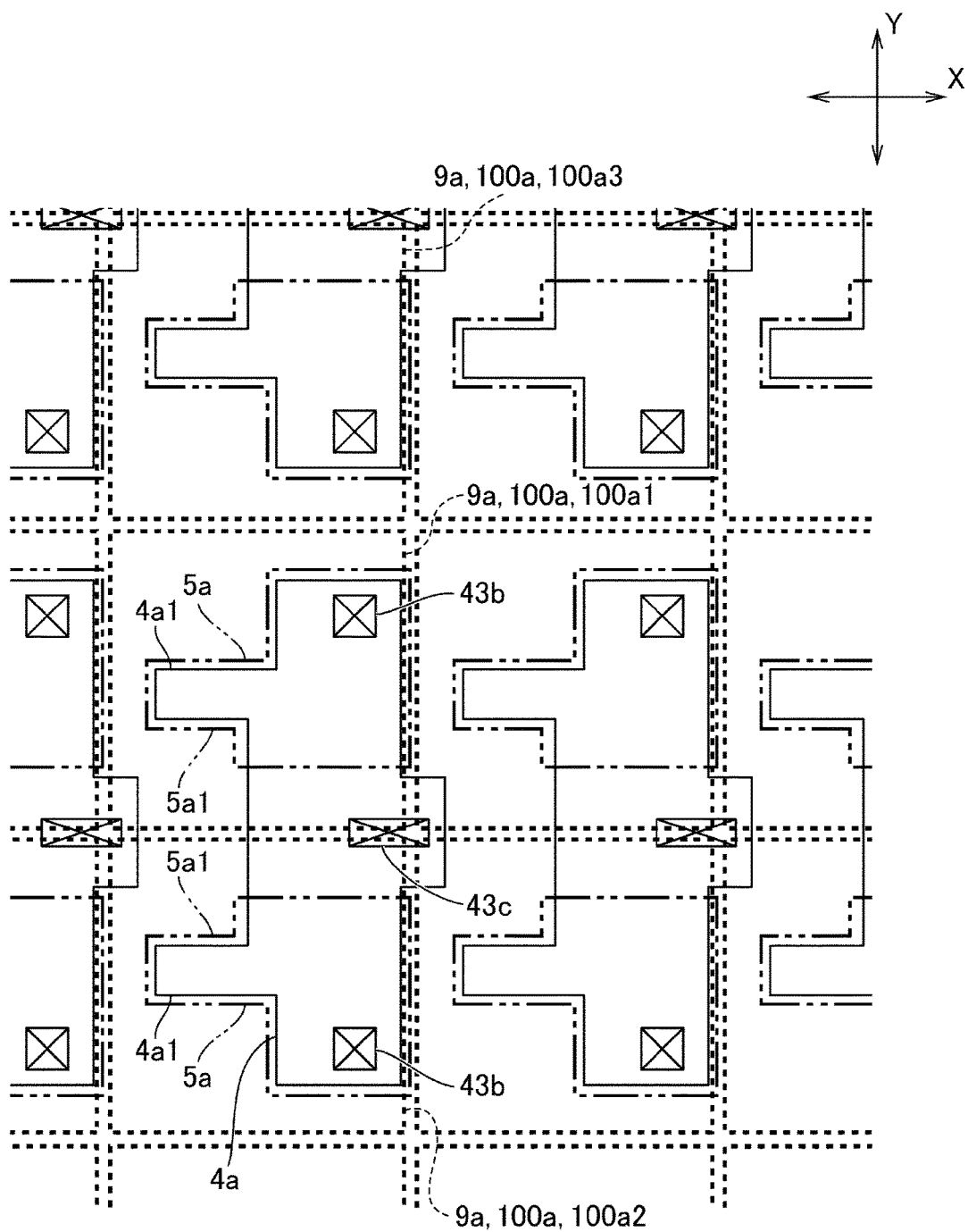
FIG. 10 is a schematic plan view of a third capacitor electrode, a fourth capacitor electrode, and related elements shown in FIG. 5.
Figure 11:
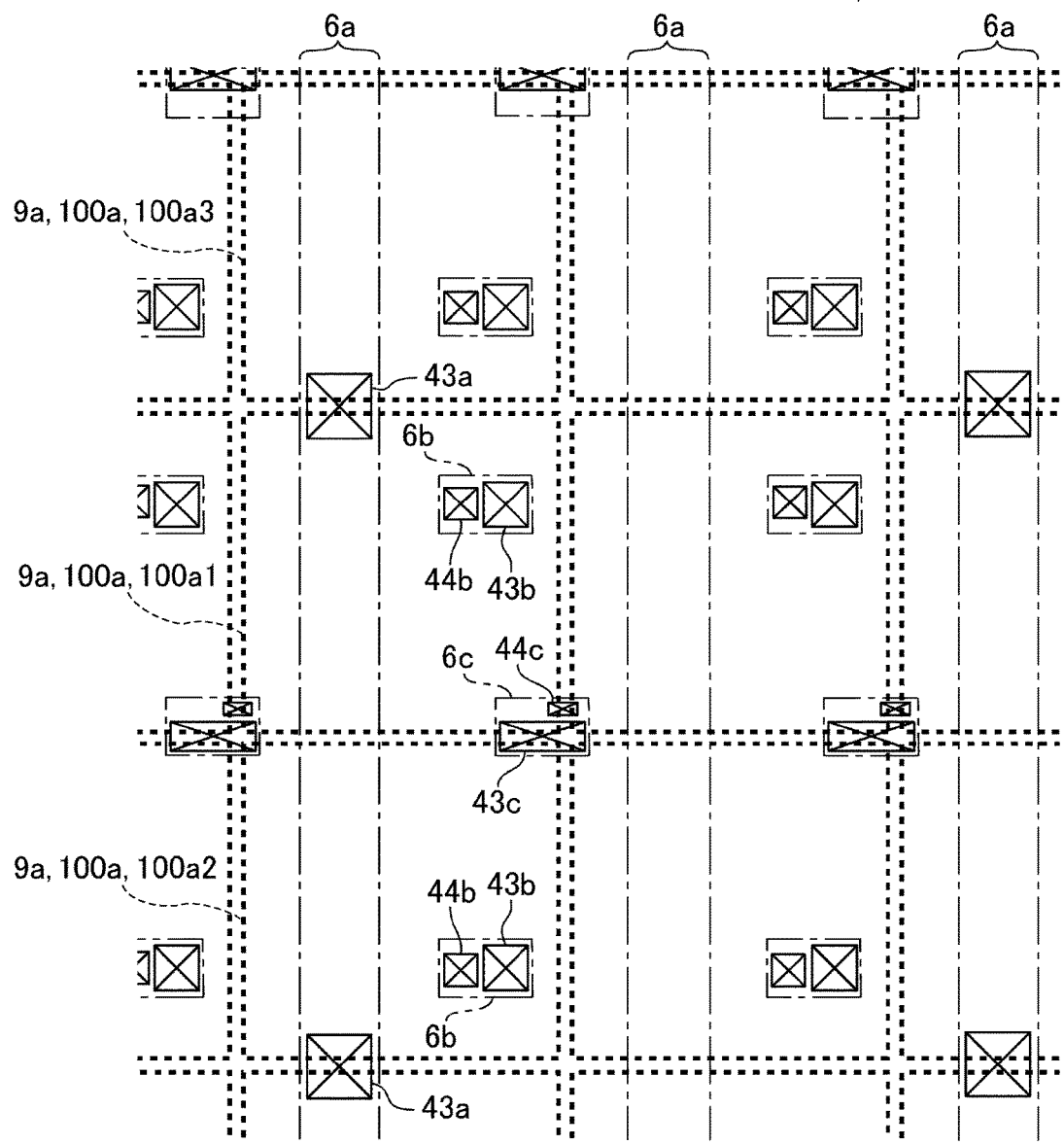
FIG. 11 is a schematic plan view of data lines and related elements shown in FIG. 5.
Figure 12:
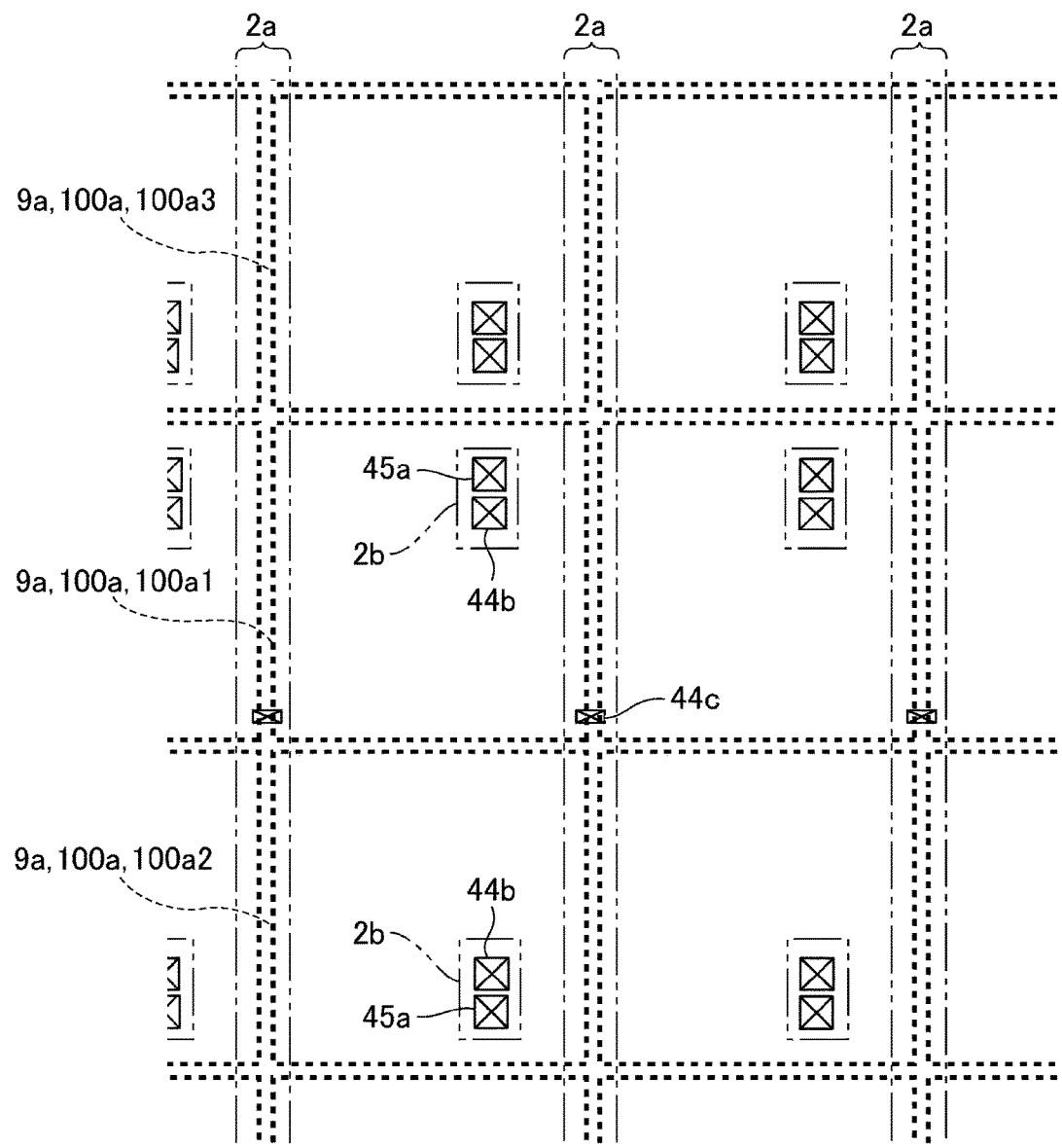
FIG. 12 is a schematic plan view of capacitor lines and related elements shown in FIG. 5.

FIG. 5 and FIG. 7 to FIG. 12 are plan views each showing the actual structure of the pixel 100a of the electro-optical device 100 of FIG. 1. FIG. 5 illustrates the element substrate 10 viewed from the surface side. FIG. 6 is a cross-sectional view of the pixel 100a shown in FIG. 5, and corresponds to a cross-sectional view taken along a line VI-VI in FIG. 5. FIG. 7 is a schematic plan view of the semiconductor layer 1a and related elements shown in FIG. 5. FIG. 8 is a schematic plan view of the scanning line 3a and related elements shown in FIG. 5. FIG. 9 is a schematic plan view of the first capacitor electrode 7a, the second capacitor electrode 8a, and related elements shown in FIG. 5. FIG. 10 is a schematic plan view of the third capacitor electrode 5a, the fourth capacitor electrode 4a, and related elements shown in FIG. 5. FIG. 11 is a schematic plan view of the data lines 6a and related elements shown in FIG. 5. FIG. 12 is a schematic plan view of the capacitor lines 2a and related elements shown in FIG. 5.

In FIG. 5 and FIG. 7 to FIG. 12, the elements are expressed by the following lines. In FIG. 5 and some other drawings, the end portions of the layers superposed on each other are illustrated as if the end portions were deviated from each other, for the sake of better visual understanding.

Scanning line 3a=bold dash-dot line
Gate electrode 3c=bold solid line
Semiconductor layer 1a=fine and short dot line
First capacitor electrode 7a=bold and long broken line
Second capacitor electrode 8a=fine and long broken line
Third capacitor electrode 5a=bold dash-dot-dot line
Fourth capacitor electrode 4a=fine solid line
Data line 6a=fine dash-dot line
Capacitor line 2a=fine dash-dot-dot line
Pixel electrode 9a=bold and short dot line As shown in FIG. 5 to FIG. 12, the data line 6a (see FIG. 11) extends in the first direction Y, and the scanning line 3a (see FIG. 8) extends in the second direction X, on the side of the first surface 10s of the element substrate 10. The pixel 100a is provided so as to correspond to an intersection between the data line 6a and the scanning line 3a. In addition, the capacitor line 2a (see FIG. 12) is formed on the first surface 10s of the element substrate 10, and in this embodiment the capacitor line 2a extends along the data line 6a, in the first direction Y.

Configuration Related to Scanning Line 3a and Pixel Switching Element 30

As shown in FIG. 6, the scanning line 3a, constituted of a conductive layer, for example including a conductive polysilicon film, a metal silicide film, a metal film, or a metal compound film, is formed on the lower side on the first surface 10s of the element substrate 10. In this embodiment, the scanning line 3a is formed of a light shield film such as tungsten silicide (WSi), and hence prevents light that has passed through the electro-optical device 100 and been reflected by another component from entering the semiconductor layer 1a, to thereby prevent a malfunction of the pixel switching element 30 originating from a photoelectric current. A translucent insulating layer 12 is formed on the upper side of the scanning line 3a, and the pixel switching element 30 including the semiconductor layer 1a is formed on the surface of the insulating layer 12. In this embodiment, the insulating layer 12 is, for example, formed of a silicon oxide film.

The pixel switching element 30 includes the semiconductor layer 1a oriented such that the longitudinal sides extend in the extending direction of the data line 6a, and a gate electrode 3c extending in the direction orthogonal to the longitudinal side of the semiconductor layer 1a and intersecting the semiconductor layer 1a, and in this embodiment the gate electrode 3c extends in the second direction X, along a region overlapping the scanning line 3a. The pixel switching element 30 includes a translucent gate insulation layer 40 between the semiconductor layer 1a and the gate electrode 3c. The semiconductor layer 1a includes a channel region 1g opposing the gate electrode 3c via the gate insulation layer 40, and a source region 1b and a drain region 1c located on the respective sides of the channel region 1g. In this embodiment, the pixel switching element 30 has a lightly doped drain (LDD) structure. Accordingly, the source region 1b and the drain region 1c each include a low-concentration region located on one side of the channel region 1g, and a high-concentration region located in a region adjacent to the low-concentration region on the opposite side of the channel region 1g.

The semiconductor layer 1a is formed of a polysilicon (polycrystalline silicon) film. The gate insulation layer 40 has a two-layer structure including a first gate insulation layer 40a, constituted of a silicon oxide film formed by thermal oxidation of the semiconductor layer 1a, and a second gate insulation layer 40b constituted of a silicon oxide film formed by low-pressure CVD under a high temperature of 700° C. to 900° C. The gate electrode 3c is formed of a conductive layer, for example including a conductive polysilicon film, a metal silicide film, a metal film, or a metal compound film. In this embodiment, the gate electrode 3c has a two-layer structure including a conductive polysilicon film and a tungsten silicide film.

As shown in FIG. 7, the semiconductor layer 1a includes a main portion 1a1 extending in the first direction Y, between the pixels 100 adjacent to each other in the second direction X and along two pixels 100 adjacent to each other in the first direction Y, first protruding portions 1a2 and 1a3 protruding in the second direction X from the respective end portions of the main portion 1a1, and a second protruding portion 1a4 protruding in the second direction X from the central portion of the main portion 1a1. In the main portion 1a1, the scanning line 3a and the gate electrode 3c, corresponding to the first pixel 100a1 between the first protruding portion 1a2 and the second protruding portion 1a4, intersect each other, and the scanning line 3a and the gate electrode 3c, corresponding to the third pixel 100a3 between the first protruding portion 1a3 and the second protruding portion 1a4, intersect each other (see FIG. 8). The second protruding portion 1a4 is electrically connected to the data line 6a via a contact hole 43a to be subsequently described. To the first protruding portion 1a2, the first capacitor electrode 7a is electrically connected via a contact hole 42a to be subsequently described, in the first pixel 100a1.

As shown in FIG. 8, the scanning line 3a and the gate electrode 3c extend along a region between the pixels 100a adjacent to each other in the first direction Y. The scanning line 3a includes a main portion 3a1 extending in the second direction X, and protruding portions 3a2 and 3a3 protruding from the main portion 3a1 in opposite directions in the first direction Y, along a region between the pixels 100a adjacent to each other in the second direction X. The protruding portions 3a2 and 3a3 overlap the main portion 1a1 of the semiconductor layer 1a. The gate electrode 3c includes a main portion 3c1 extending in the second direction X, protruding portions 3c2 and 3c3 protruding from the main portion 3c1 in one direction in the first direction Y, along the region between the pixels 100a adjacent to each other in the second direction X, and a recessed portion 3c4 recessed from the protruding portion 3c3 in one direction in the first direction Y, along the region between the pixels 100a adjacent to each other in the second direction X. The protruding portion 3c2 and the recessed portion 3c4 define a length of the portion overlapping the semiconductor layer 1a (channel length).

A contact hole 12a is formed so as to penetrate through the insulating layer 12 and the gate insulation layer 40 (see FIG. 6), in the region where the scanning line 3a and the portion of the gate electrode 3c between the protruding portions 3c2 and 3c3 overlap, and the gate electrode 3c and the scanning line 3a are electrically connected to each other via the contact hole 12a.

Configuration of Storage Capacitor 55

As shown in FIG. 6, a translucent interlayer insulating film 41, constituted of a silicon oxide film or the like, is formed on the upper side of the gate electrode 3c, and a light absorption layer 550 constituted of a titanium nitride film or the like, the fourth capacitor electrode 4a, the second dielectric layer 552a, the third capacitor electrode 5a, an interlayer insulating film 42, the first capacitor electrode 7a, the first dielectric layer 551a, and the second capacitor electrode 8a are sequentially stacked, on the upper side of the interlayer insulating film 41. Accordingly, the first capacitor electrode 7a, the first dielectric layer 551a, and the second capacitor electrode 8a constitute the first storage capacitor 551, and the fourth capacitor electrode 4a, the second dielectric layer 552a, and the third capacitor electrode 5a constitute the second storage capacitor 552.

The first capacitor electrode 7a is electrically connected to the drain region 1c of the pixel switching element 30, via the contact hole 42a penetrating through the interlayer insulating films 41 and 42, and the gate insulation layer 40. The third capacitor electrode 5a and the first capacitor electrode 7a are in contact with each other at the bottom portion of an opening 42c formed in the interlayer insulating film 42, and electrically connected with each other. Thus, the third capacitor electrode 5a is electrically connected to the drain region 1c of the pixel switching element 30, via the first capacitor electrode 7a.

The first capacitor electrode 7a is formed inside the contact hole 42a, with the first dielectric layer 551a and the second capacitor electrode 8a formed on the upper side thereof. Therefore, the first capacitor electrode 7a, the first dielectric layer 551a, and the second capacitor electrode 8a also constitute the first storage capacitor 551 inside the contact hole 42a.

As shown in FIG. 9, the first capacitor electrode 7a is independently formed in each of the plurality of pixels 100a, and electrically connected to the drain region 1c of the semiconductor layer 1a via the contact hole 42a shown in FIG. 7, in each of the pixels 100a. In contrast, the second capacitor electrode 8a is integrally formed in the first pixel 100a1 and the second pixel 100a2, and electrically connected to the capacitor line 2a via a contact hole 43c to be subsequently described. The entirety of the first capacitor electrode 7a overlaps the second capacitor electrode 8a, and a protruding portion 7a1 of the first capacitor electrode 7a, protruding toward the contact hole 42a is electrically connected to the drain region 1c of the semiconductor layer 1a, via the contact hole 42a.

As shown in FIG. 10, the third capacitor electrode 5a is independently formed in each of the plurality of pixels 100a, and electrically connected to the pixel electrode 9a via a contact hole 43b to be subsequently described with reference to FIG. 6, in each of the pixels 100a. Thus, the first capacitor electrode 7a is electrically connected to the pixel electrode 9a via the third capacitor electrode 5a. In contrast, the fourth capacitor electrode 4a is integrally formed in the first pixel 100a1 and the second pixel 100a2, and electrically connected to the capacitor line 2a via the contact hole 43c. In this embodiment, generally the entirety of the third capacitor electrode 5a overlaps the fourth capacitor electrode 4a. For example, the third capacitor electrode 5a and the fourth capacitor electrode 4a respectively include protruding portions 5a1 and 4a1 protruding in the second direction X, and generally the entirety of the third capacitor electrode 5a, including the protruding portion 5a1, overlaps the fourth capacitor electrode 4a.

The first capacitor electrode 7a, the second capacitor electrode 8a, the third capacitor electrode 5a, and the fourth capacitor electrode 4a are each formed of a conductive layer, for example including a conductive polysilicon film, a metal silicide film, a metal film, or a metal compound film. In this embodiment, the second capacitor electrode 8a and the fourth capacitor electrode 4a are each formed of a conductive polysilicon layer, or a metal silicide layer such as tungsten silicide. The first dielectric layer 551a, and the second dielectric layer 552a may be formed of a silicon compound film such as a silicon oxide film or a silicon nitride film, or alternatively of a dielectric film having a high dielectric constant, such as an aluminum oxide film, a titanium oxide film, a tantalum oxide film, a niobium oxide film, a hafnium oxide film, a lanthanum oxide film, or a zirconium oxide film.

Configuration Related to Data Line 6a

Referring again to FIG. 6, an interlayer insulating film 43, for example constituted of a silicon oxide film, is formed on the upper side of the storage capacitor 55, and the data line 6a and relay electrodes 6b and 6c are formed of the same conductive layer, on the upper side of the interlayer insulating film 43. The interlayer insulating film 43 has a flat surface. The data line 6a and the relay electrodes 6b and 6c are each formed of a conductive layer, for example including a conductive polysilicon film, a metal silicide film, a metal film, or a metal compound film, and in this embodiment the data line 6a and the relay electrodes 6b and 6c are, for example, metal wirings formed of stacked layers including an aluminum film and a titanium film. The data line 6a is electrically connected to the source region 1b of the semiconductor layer 1a, via the contact hole 43a penetrating through the interlayer insulating films 43, 42, and 41, and the gate insulation layer 40. The relay electrode 6b is electrically connected to the third capacitor electrode 5a, via the contact hole 43b penetrating through the interlayer insulating films 43 and 42. The relay electrode 6c is electrically connected to the second capacitor electrode 8a and the fourth capacitor electrode 4a, via the contact hole 42c penetrating through the interlayer insulating films 43 and 42. The relay electrode 6c is the conductive layer electrically connecting the capacitor line 2a to the second capacitor electrode 8a and the fourth capacitor electrode 4a.

In this embodiment, the contact hole 43c is formed at the position overlapping an end portion of the second capacitor electrode 8a, and includes a stepped portion formed so as to expose a part of a surface 8a0 of the second capacitor electrode 8a on the opposite side of the element substrate 10, and a bottom portion formed so as to expose a part of a surface 4a0 of the fourth capacitor electrode 4a on the opposite side of the element substrate 10. Accordingly, the relay electrode 6c is electrically connected to the second capacitor electrode 8a and the fourth capacitor electrode 4a, in each of the contact holes 43c.

As shown in FIG. 11, the relay electrode 6b and the contact hole 43b are formed in each of the plurality of pixels 100a. In contrast, the relay electrode 6c and the contact hole 43c are integrally formed in the first pixel 100a1 and the second pixel 100a2. In this embodiment, the relay electrode 6c and the contact hole 43c are formed in the boundary region between the first pixel 100a1 and the second pixel 100a2. Accordingly, the relay electrode 6c and the contact hole 43c are formed at the central portion of the second capacitor electrode 8a in the first direction Y, and at the central portion of the fourth capacitor electrode 4a in the first direction Y.

Configuration of Capacitor Line 2a

Still referring to FIG. 6, a translucent interlayer insulating film 44, for example constituted of a silicon oxide film, is formed on the upper side of the data line 6a and the relay electrode 6b, and the capacitor line 2a and the relay electrode 2b are formed of the same conductive layer, on the upper side of the interlayer insulating film 44. The interlayer insulating film 44 has a flat surface. The capacitor line 2a and the relay electrode 2b are each formed of a conductive layer, for example including a conductive polysilicon film, a metal silicide film, a metal film, or a metal compound film, and in this embodiment the capacitor line 2a and the relay electrode 2b are, for example, aluminum wiring layers formed of an aluminum alloy film, or stacked layers including an aluminum film and a titanium nitride film.

In this embodiment, the relay electrode 2b is electrically connected to the relay electrode 6b via a contact hole 44b penetrating through the interlayer insulating film 44. The capacitor line 2a is electrically connected to the relay electrode 6c via a contact hole 44c penetrating through the interlayer insulating film 44. The capacitor line 2a receives the common potential Vcom, and applies the common potential Vcom to the second capacitor electrode 8a and the fourth capacitor electrode 4a through the relay electrode 6c. As shown in FIG. 12, the capacitor line 2a extends in the first direction Y so as to overlap the semiconductor layer 1a, and serves as a light shielding layer.

As shown in FIG. 6, a translucent interlayer insulating film 45, for example constituted of a silicon oxide film, is formed on the upper side of the capacitor line 2a and the relay electrode 2b. The entirety, or a portion on the upper side (on the side of the electro-optical layer 50) of the interlayer insulating film 45 is constituted of a boron silicate glass (BSG) layer. The boron silicate glass layer can be formed, for example, by normal-pressure CVD, at a deposition temperature of 350° C. to 450° C. To form the boron silicate glass layer, $SiH_4$, $B_2H_6$, or $O_3$ may be employed as the material gas.

The interlayer insulating film 45 has a flat surface. The pixel electrode 9a, constituted of a reflective conductive layer, for example including an aluminum film or an aluminum alloy film, is formed on the upper side (on the side of the electro-optical layer 50) of the interlayer insulating film 45. The pixel electrode 9a partially overlaps the relay electrode 2b, and is electrically connected to the relay electrode 2b via a contact hole 45a penetrating through the interlayer insulating film 45. The inner space of the contact hole 45a is filled with a conductive layer that serves as a plug 9f, and the pixel electrode 9a is electrically connected to the relay electrode 2b via the plug 9f. Therefore, the entire surface of the pixel electrode 9a is flat, including the region where the contact hole 45a is formed.

Important Effects of Embodiment

As described thus far, in the electro-optical device 100 according to this embodiment, the plurality of pixels 100a each include, on the side of the first surface 10s of the element substrate 10, the pixel electrode 9a, the pixel switching element 30, and the storage capacitor 55, the pixel switching element 30 and the storage capacitor 55 being electrically connected to the pixel electrode 9a. The storage capacitor 55 includes, between the element substrate 10 and the capacitor line 2a, the first storage capacitor 551, and the second storage capacitor 552 stacked on the first storage capacitor 551 and electrically connected thereto in parallel. Therefore, the plan-view area occupied by the storage capacitor 55 is not increased, despite increasing the electrostatic capacitance of the storage capacitor 55.

In addition, in the first storage capacitor 551 and the second storage capacitor 552, in which the first capacitor electrode 7a, the second capacitor electrode 8a, the third capacitor electrode 5a, and the fourth capacitor electrode 4a are stacked, the second capacitor electrode 8a is integrally formed in the first pixel 100a1 and the second pixel 100a2 out of the plurality of pixels 100a, and electrically connected to the capacitor line 2a at one point. The mentioned configuration allows reduction in number of the contact holes between the second capacitor electrode 8a and the capacitor line 2a, to thereby alleviate the difficulty in aligning the pixels 100a in a finer pitch, originating from restrictions on the availability of the area for the contact holes, and on the layout design thereof. Consequently, the above configuration facilitates the pixels 100a, each including the plurality of capacitor electrodes stacked therein, to be aligned in a finer pitch.

The fourth capacitor electrode 4a is, like the second capacitor electrode 8a, integrally formed in the first pixel 100a1 and the second pixel 100a2, and electrically connected to the capacitor line 2a at one point. In addition, the capacitor line 2a is electrically connected to the second capacitor electrode 8a and the fourth capacitor electrode 4a, at the same point where the contact hole 43c is formed. The mentioned configuration allows reduction in number of the contact holes, to thereby alleviate the difficulty in aligning the pixels 100a in a finer pitch, originating from restrictions on the availability of the area for the contact holes, and on the layout design thereof. Consequently, the above configuration facilitates the pixels 100a, each including the plurality of capacitor electrodes stacked therein, to be aligned in a finer pitch.

The capacitor line 2a is electrically connected to the central portion of the second capacitor electrode 8a in the first direction Y, and to the central portion of the fourth capacitor electrode 4a in the first direction Y. The mentioned configuration suppresses fluctuation in electric resistance in each of the pixels 100a including the second capacitor electrode 8a and the fourth capacitor electrode 4a, despite the second capacitor electrode 8a and the fourth capacitor electrode 4a being integrally formed in two of the pixels 100a.

The fourth capacitor electrode 4a, the second dielectric layer 552a, the third capacitor electrode 5a, the first capacitor electrode 7a, the first dielectric layer 551a, and the second capacitor electrode 8a are sequentially stacked between the element substrate 10 and the capacitor line 2a. In addition, the capacitor line 2a is electrically connected to the second capacitor electrode 8a and the fourth capacitor electrode 4a, via the conductive layer (relay electrode 6c) formed in the contact hole 43c (first contact hole), penetrating through the interlayer insulating film 43 (first interlayer insulating film) formed between the second capacitor electrode 8a and the capacitor line 2a, and exposing a part of the surface 8a0 of the second capacitor electrode 8a opposite to the element substrate 10, and a part of the surface 4a0 of the fourth capacitor electrode 4a opposite to the element substrate 10. The mentioned configuration allows the capacitor line 2a to be electrically connected to the second capacitor electrode 8a and the fourth capacitor electrode 4a at the same point, utilizing the single contact hole 43a and the commonly shared conductive layer (relay electrode 6c).

The first capacitor electrode 7a is stacked together with the first dielectric layer 551 and the second capacitor electrode 8a, inside the contact hole 42a (second contact hole) formed so as to penetrate through the interlayer insulating films 41 and 42 (second interlayer insulating film) formed between the pixel switching element 30 and the first capacitor electrode 7a, and to reach the semiconductor layer 1a of the pixel switching element 30, and is electrically connected to the semiconductor layer 1a. The mentioned configuration allows a portion of the contact hole 42a along the inner wall thereof to be utilized as a region where the first storage capacitor 551 is to be formed, thereby facilitating an increase in electrostatic capacitance of the first storage capacitor 551.

In the two pixels (second pixel 100a21 and third pixel 100a3) adjacent to each other in the first direction Y, out of the plurality of pixels 100a, the semiconductor layer 1a is integrally formed, and electrically connected to the data line 6a at one point. The mentioned configuration allows reduction in number of the contact holes 43a connecting between the semiconductor layer 1a and the data line 6a, to thereby alleviate the difficulty in aligning the pixels 100a in a finer pitch, originating from restrictions on the availability of the area for the contact holes, and on the layout design thereof.

Other Embodiments

Although both of the second capacitor electrode 8a and the fourth capacitor electrode 4a are integrally formed in the first pixel 100a1 and the second pixel 100a2 in the foregoing embodiment, only the second capacitor electrode 8a may be integrally formed in the first pixel 100a1 and the second pixel 100a2.

Although the second capacitor electrode 8a and the fourth capacitor electrode 4a are integrally formed in the first pixel 100a1 and the second pixel 100a2 in the foregoing embodiment, the second capacitor electrode 8a may be integrally formed in the first pixel 100a1 and the second pixel 100a2, and the fourth capacitor electrode 4a may be integrally formed in the first pixel 100a1 and the third pixel 100a3.

Although the second capacitor electrode 8a and the fourth capacitor electrode 4a are integrally formed in two of the pixels (first pixel 100a1 and second pixel 100a2) in the foregoing embodiment, these capacitor electrodes may be integrally formed in three or more of the pixels 100a.

Although the semiconductor layer 1a is integrally formed in two of the pixels (first pixel 100a1 and third pixel 100a3) in the foregoing embodiment, the semiconductor layer 1a may be integrally formed in three or more of the pixels 100a.

Although the capacitor line 2a extends in the first direction Y in the foregoing embodiment, the invention is also applicable to such a case where the capacitor line 2a extends in the second direction X, or extends both in the first direction Y and the second direction X.

Although the second capacitor electrode 8a and the fourth capacitor electrode 4a are integrally formed in the plurality of pixels 100a aligned in the first direction Y intersecting the extending direction of the scanning line 3a in the foregoing embodiment, the direction in which the scanning line 3a extends may be defined as the first direction, and the second capacitor electrode 8a and the fourth capacitor electrode 4a may be integrally formed in a plurality of pixels 100a adjacent to each other in the first direction defined as above.

The electro-optical device to which the invention is applicable is not limited to the LCD device of the VA mode. The invention is also applicable in the case where the electro-optical device 100 is an LCD device of the twisted nematic (TN) mode or the optically compensated bend (OCB) mode. Alternatively, the invention may be applied to a transmissive LCD device.

Exemplary Incorporation in Electronic Apparatus

Figure 13:
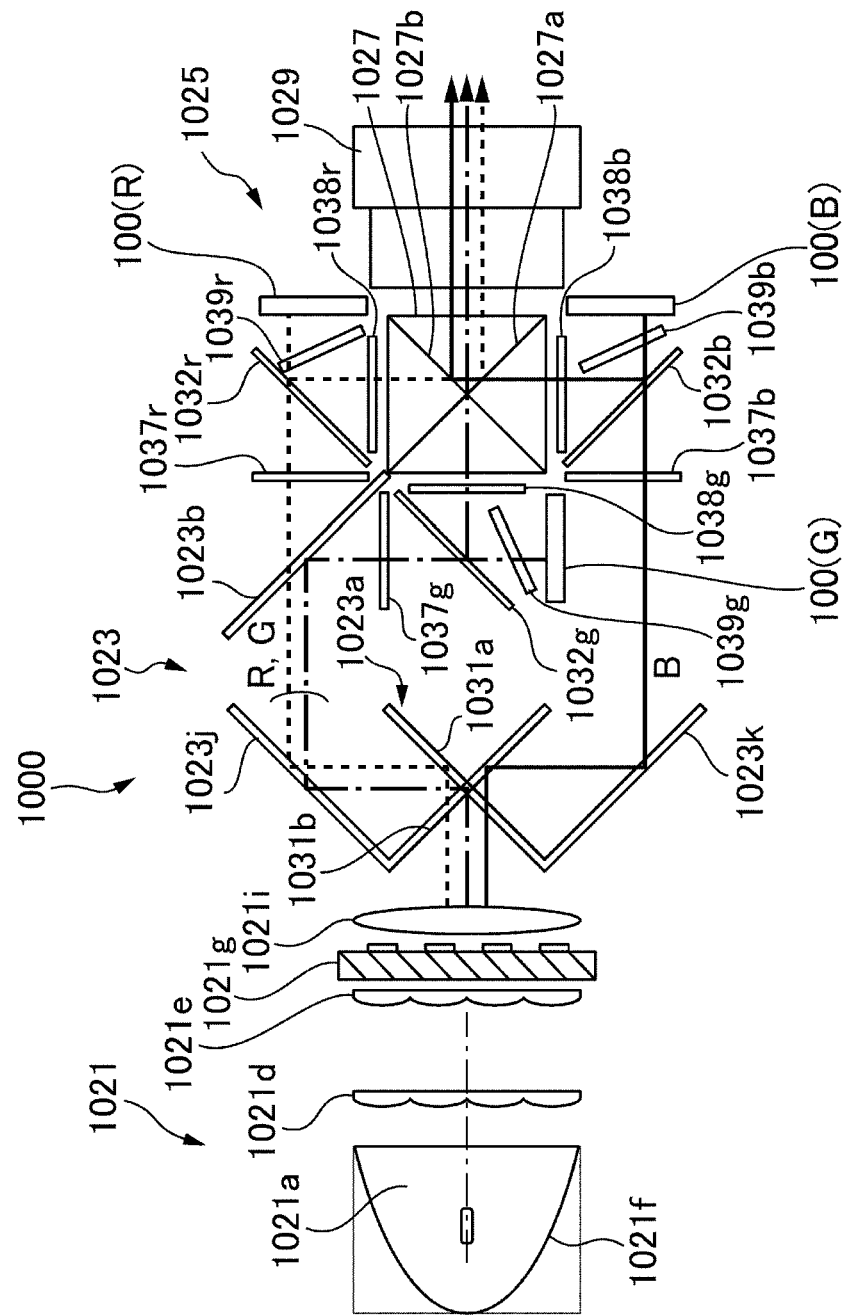
FIG. 13 is a schematic side view of a projection display device including the electro-optical device according to the embodiment.

An electronic apparatus, in which the electro-optical device 100 according to the foregoing embodiment is incorporated, will be described hereunder. FIG. 13 is a schematic side view of a projection display device (electronic apparatus) including the electro-optical device 100 according to the embodiment.

A projection display device 1000 shown in FIG. 13 includes a light source unit 1021 that outputs a source light, a color separation/light guide optical system 1023 that separates the source light outputted from the light source unit 1021 into three colors of red, green, and blue, and an optical modulation unit 1025 that receives the source light of the mentioned colors outputted from the color separation/light guide optical system 1023. The optical modulation unit 1025 includes the electro-optical device 100. The projection display device 1000 also includes a cross dichroic prism 1027 (synthetic optical system) that synthesizes image light of each color outputted from the optical modulation unit 1025, and a projection optical system 1029 for projecting the image light that has passed through the cross dichroic prism 1027 onto a non-illustrated screen.

In the projection display device 1000 thus configured, the light source unit 1021 includes a light source 1021a, a pair of fly eye optical systems 1021d and 1021e, a polarization converter 1021g, and a superposition lens 1021i. In this example, the light source unit 1021 includes a reflector 1021f having a paraboloidal surface, and outputs parallel light. The fly eye optical systems 1021d and 1021e includes a plurality of element lenses arranged in a matrix pattern in a plane orthogonal to the optical axis of the system, to divide the source light and individually condense and diverge the divided light. The polarization converter 1021g converts the source light outputted from the fly eye optical system 1021e, for example into only a p-polarized component parallel to the sheet surface of FIG. 13, and provides such light to the optical system on the downstream side of the optical path. The superposition lens 1021i converges the source light that has passed through the polarization converter 1021g as a whole, to thereby enable each of the electro-optical devices 100(R), 100(G), and 100(B) provided in the optical modulation unit 1025 to uniformly perform superimposed projection.

The color separation/light guide optical system 1023 includes a cross dichroic mirror 1023a, a dichroic mirror 1023b, and reflecting mirrors 1023j and 1023k. In the color separation/light guide optical system 1023, generally white source light from the light source unit 1021 is incident upon the cross dichroic mirror 1023a. Red light (R) reflected by a first dichroic mirror 1031a included in the cross dichroic mirror 1023a is reflected by the reflecting mirror 1023j is transmitted through the dichroic mirror 1023b, and incident upon the electro-optical device 100(R) for the red color maintaining the p-polarized state, through an incident side polarizing plate 1037r, a wire grid polarizing plate 1032r that transmits p-polarized light and reflects s-polarized light, and an optical compensation plate 1039r.

Green light (G) reflected by the first dichroic mirror 1031a is reflected by the reflecting mirror 1023j, and also by the dichroic mirror 1023b, and then incident upon the electro-optical device 100(G) for the green color maintaining the p-polarized state, through an incident side polarizing plate 1037g, a wire grid polarizing plate 1032g that transmits p-polarized light and reflects s-polarized light, and an optical compensation plate 1039g.

Blue light (B) reflected by a second dichroic mirror 1031b included in the cross dichroic mirror 1023a is reflected by the reflecting mirror 1023k, and incident upon the electro-optical device 100(B) for the blue color maintaining the p-polarized state, through an incident side polarizing plate 1037b, a wire grid polarizing plate 1032b that transmits p-polarized light and reflects s-polarized light, and an optical compensation plate 1039b. Here, the optical compensation plates 1039r, 1039g, and 1039b each adjust the polarization status of the light inputted to and outputted from the electro-optical device 100, to thereby optically compensate the characteristics of the liquid crystal layer.

In the projection display device 1000 configured as above, the red, green, and blue lights inputted through the optical compensation plates 1039r, 1039g, and 1039b are each modulated in the electro-optical device 100 of the corresponding color. At this point, the lights of the s-polarized component outputted from the electro-optical devices 100 (R), 100(G), and 100(B) are respectively reflected by the wire grid polarizing plates 1032r, 1032g, and 1032b, and incident upon the cross dichroic prism 1027 through the output side polarizing plates 1038r, 1038g, and 1038b. The cross dichroic prism 1027 includes a first dielectric multilayer film 1027a and a second dielectric multilayer film 1027b intersecting each other in a cross shape, the former of which reflects red light (R) and the latter of which reflects blue light (B). Accordingly, the red, green, and blue lights are synthesized in the cross dichroic prism 1027, and outputted to the projection optical system 1029. Then the projection optical system 1029 projects the color image light synthesized in the cross dichroic prism 1027, to a non-illustrated screen in a desired magnification.

Other Projection Display Devices

Here, the projection display device may include, as the light source, for example LED light sources that each output the light of one color, and the lights outputted from such LED light sources may be respectively supplied to other LCD devices.

Other Electronic Apparatuses

The electronic apparatus in which the electro-optical device 100 according to the invention can be incorporated is not limited to the foregoing projection display device 1000. The electro-optical device 100 may be incorporated, for example, in such electronic apparatuses as a projection head-up display (HUD), a direct-view head mount display (HMD), a personal computer, a digital still camera, and a liquid crystal TV set.

The entire disclosure of Japanese Patent Application No. 2016-228636, filed Nov. 25, 2016 is expressly incorporated by reference herein.

What is claimed is:

1. An electro-optical device comprising:
    a plurality of pixels aligned in a first direction and a second direction intersecting the first direction: and
    a capacitor line extending in at least one of the first direction and the second direction,
    wherein the plurality of pixels each include a pixel electrode, a pixel switching element, and a storage capacitor which are located on a side of a first surface of an element substrate, the pixel switching element and the storage capacitor being electrically connected to the pixel electrode,
    the storage capacitor includes, between the element substrate and the capacitor line, a first storage capacitor, and a second storage capacitor stacked on the first storage capacitor and electrically connected thereto in parallel,
    the first storage capacitor includes a first capacitor electrode electrically connected to the pixel electrode, and a second capacitor electrode electrically connected to the capacitor line and stacked on the first capacitor electrode via a first dielectric layer,
    the second storage capacitor includes a third capacitor electrode electrically connected to the pixel electrode, and a fourth capacitor electrode electrically connected to the capacitor line and stacked on the third capacitor electrode via a second dielectric layer, and
    the second capacitor electrode is integrally formed in a first pixel and a second pixel out of the plurality of pixels, the second pixel being located adjacent the first pixel in the first direction, and is electrically connected to the capacitor line at least at one point.

2. The electro-optical device according to claim 1, wherein the fourth capacitor electrode is integrally formed in the first pixel and the second pixel, and electrically connected to the capacitor line at one point.

3. An electronic apparatus comprising the electro-optical device according to claim 2.

4. The electro-optical device according to claim 1, wherein the capacitor line is electrically connected to the second capacitor electrode and the fourth capacitor electrode, at a same point.

5. The electro-optical device according to claim 4, wherein the capacitor line is electrically connected to a central portion of the second capacitor electrode in the first direction, and to a central portion of the fourth capacitor electrode in the first direction.

6. An electronic apparatus comprising the electro-optical device according to claim 5.

7. The electro-optical device according to claim 4, wherein the fourth capacitor electrode, the second dielectric layer, the third capacitor electrode, the first capacitor electrode, the first dielectric layer, and the second capacitor electrode are sequentially stacked between the element substrate and the capacitor line, and
    the capacitor line is electrically connected to the second capacitor electrode and the fourth capacitor electrode, via a conductive layer formed in a first contact hole, penetrating through a first interlayer insulating film formed between the second capacitor electrode and the capacitor line, and exposing a part of a surface of the second capacitor electrode opposite to the element substrate, and a part of a surface of the fourth capacitor electrode opposite to the element substrate.

8. An electronic apparatus comprising the electro-optical device according to claim 7.

9. An electronic apparatus comprising the electro-optical device according to claim 4.

10. The electro-optical device according to claim 1, wherein the fourth capacitor electrode, the second dielectric layer, the third capacitor electrode, the first capacitor electrode, the first dielectric layer, and the second capacitor electrode are sequentially stacked between the element substrate and the capacitor line, and
    the first capacitor electrode is stacked together with the first dielectric layer and the second capacitor electrode, inside a second contact hole, formed so as to penetrate through a second interlayer insulating film formed between the pixel switching element and the first capacitor electrode, and to reach the pixel switching element, and electrically connected to the pixel switching element.

11. An electronic apparatus comprising the electro-optical device according to claim 10.

12. The electro-optical device according to claim 1, wherein the capacitor line includes an aluminum wiring layer, and the second capacitor electrode and the fourth capacitor electrode each include a conductive polysilicon layer or a metal silicide layer.

13. An electronic apparatus comprising the electro-optical device according to claim 12.

14. The electro-optical device according to claim 1, further comprising a data line extending in the first direction,
wherein the plurality of pixels each include a semiconductor layer constituting a part of the pixel switching element, and the semiconductor layer is integrally formed in two pixels out of the plurality of pixels, the two pixels being located adjacent to each other in the first direction, and electrically connected to the data line at least at one point.

15. The electro-optical device according to claim 14, wherein the semiconductor layer is integrally formed in the first pixel, and a third pixel adjacent thereto on an opposite side of the second pixel.

16. An electronic apparatus comprising the electro-optical device according to claim 15.

17. An electronic apparatus comprising the electro-optical device according to claim 14.

18. The electro-optical device according to claim 1, further comprising a translucent counter substrate opposing the first surface of the element substrate,
wherein the pixel electrode includes a reflective conductive layer.

19. An electronic apparatus comprising the electro-optical device according to claim 18.

20. An electronic apparatus comprising the electro-optical device according to claim 1.

* * * * *